United States Patent
Ito

(10) Patent No.: US 7,336,060 B2
(45) Date of Patent: Feb. 26, 2008

(54) CIRCUIT AND METHOD FOR CONTROLLING A DC-DC CONVERTER BY ENABLING THE SYNCHRONOUS RECTIFIER DURING UNDERVOLTAGE LOCKOUT

(75) Inventor: Hidenobu Ito, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/225,186

(22) Filed: Sep. 14, 2005

(65) Prior Publication Data

US 2006/0220631 A1    Oct. 5, 2006

(30) Foreign Application Priority Data

Mar. 31, 2005   (JP) ............................. 2005-103940

(51) Int. Cl.
*G05F 5/00* (2006.01)
*H02H 7/00* (2006.01)
*H02H 3/24* (2006.01)

(52) U.S. Cl. ..................... 323/299; 361/18; 361/92

(58) Field of Classification Search ............ 363/50, 363/49, 56.08, 56.11; 323/299, 303, 901, 323/300; 361/18, 92
See application file for complete search history.

(56) References Cited

U.S. PATENT DOCUMENTS 4,009,420 A * 2/1977 Martinez-dePison ......... 361/88
5,350,988 A * 9/1994 Le .............................. 318/618
5,847,554 A * 12/1998 Wilcox et al. ............... 323/282
6,191,964 B1 * 2/2001 Boylan et al. ................. 363/89
6,674,657 B2 * 1/2004 Nagaya et al. ................ 363/50
6,696,772 B2 * 2/2004 Nieminen .................... 307/151
6,919,713 B2 * 7/2005 Hoshino et al. ............. 323/267
6,924,633 B2 * 8/2005 Sanzo et al. ................. 323/283
6,947,272 B2 * 9/2005 Daniels et al. ............. 361/93.9
2005/0243481 A1 * 11/2005 Williams et al. .............. 361/18
2005/0248361 A1 * 11/2005 O'Gorman et al. ......... 324/772

FOREIGN PATENT DOCUMENTS

JP      05-030755 A    2/1993
JP      09-154275 A    6/1997
JP      10-323026 A    12/1998

OTHER PUBLICATIONS

ADP3410 Dual MOSFET Driver with Bootstrapping, Analog Devices, Rev A, 2002, pp. 1 and 10.*

* cited by examiner

*Primary Examiner*—Bao Q. Vu
*Assistant Examiner*—Harry Behm
(74) *Attorney, Agent, or Firm*—Arent Fox LLP

(57) ABSTRACT

A control circuit for a DC-DC converter that prevents a deficiency from occurring due to sudden interruption in power supply. The control circuit activates and inactivates a main switching output transistor and a synchronous rectification output transistor to convert the input voltage to an output voltage. The output voltage is smoothed by a smoothing capacitor. When the input voltage decreases, the control circuit activates the synchronous rectification output transistor to readily discharge the smoothing capacitor via the synchronous rectification output transistor.

14 Claims, 9 Drawing Sheets

CIRCUIT AND METHOD FOR CONTROLLING A DC-DC CONVERTER BY ENABLING THE SYNCHRONOUS RECTIFIER DURING UNDERVOLTAGE LOCKOUT

CROSS-REFERENCE TO RELATED APPLICATIONS

This application is based upon and claims the benefit of priority from the prior Japanese Patent Application No. 2005-103940, filed on Mar. 31, 2005, the entire contents of which are incorporated herein by reference.

BACKGROUND OF THE INVENTION

The present invention relates to a DC-DC converter, and more particularly, to a circuit and method for controlling a DC-DC converter.

A portable electronic device, such as a notebook type personal computer and a gaming device, is provided with a plurality of semiconductor integrated circuit devices and a battery for supplying operational power to the plurality of semiconductor integrated circuit devices. Since the output voltage decreases as the battery discharges, a DC-DC converter is used to keep the operational power voltage constant.

FIG. 1 is a schematic circuit diagram showing a first example of a voltage control DC-DC converter 1 in the prior art. The DC-DC converter 1 includes a control circuit 2, a choke coil L1, a smoothing capacitor C1, and a discharge resistor BR.

The control circuit 2 receives input voltage Vi as power supply voltage Vcc. The control circuit 2 also receives output voltage Vo as a feedback signal FB of the DC-DC converter 1. The control circuit 2 includes a power supply circuit 3, an error amplifier 4, a PWM comparator 5, a triangular wave oscillator 6, a drive circuit (DRVH) 7, a drive circuit (DRVL) 8, output transistors T1 and T2, and resistors R1 and R2. The power supply circuit 3 generates internal power from the power supply voltage Vcc and supplies the internal power to the error amplifier 4, the PWM comparator 5, and the triangular wave oscillator 6.

The error amplifier 4 of the control circuit 2 amplifies differential voltage between voltage, which is obtained by dividing the feedback signal FB with the resistors R1 and R2, and voltage of a reference power supply e1 to provide an amplified error signal to a non-inverting input terminal of the PWM comparator 5. The reference power supply e1 is set such that its voltage is substantially equal to the divided voltage generated by the resistors R1 and R2 when the output voltage Vo reaches a specified value.

The triangular wave oscillator 6 provides a triangular wave signal having a constant frequency to an inverting input terminal of the PWM comparator 5. The PWM comparator 5 generates an output signal QH at a high (H) level and an output signal QL at a low (L) level when the input voltage at the non-inverting input terminal is higher than the voltage at the inverting input terminal. The PWM comparator 5 generates the output signal QH at an L level and the output signal QL at an H level when the input voltage at the non-inverting input terminal is lower than the voltage at the inverting input terminal.

The drive circuit (DRVH) 7 converts the level of the output signal QH of the PWM comparator 5 to generate a control signal DH and provides the control signal DH to the gate of the output transistor T1. The drive circuit (DRVL) 8 converts the level of the output signal QL of the PWM comparator 5 to generate a control signal DL and provides the control signal DL to the gate of the output transistor T2. The output transistor T1 is a P-channel MOS transistor having a source receiving a first power supply voltage Vcc. The output transistor T2 is an N-channel MOS transistor having a source connected to a low-potential power supply (ground). The output transistor T1 is activated in response to an L level control signal DH. The output transistor T2 is activated in response to an H level control signal DL.

In the voltage control DC-DC converter 1, the output transistor T1 is activated in fixed cycles in accordance with the triangular wave signal from the triangular wave oscillator 6. The activation of the output transistor T1 increases the output voltage Vo, and the output voltage Vo is smoothed by the smoothing capacitor C1. When the output transistor T1 is inactivated, energy stored in the choke coil L1 is discharged. As the energy in the choke coil L1 decreases, the output voltage Vo decreases. When the divided voltage generated by the resistors R1 and R2 becomes lower than the voltage of the reference power supply e1, the output transistor T1 is activated.

An increase in the output voltage Vo decreases the output voltage of the error amplifier 4 and the activation time of the output transistor T1. A decrease in the output voltage Vo increases the output voltage of the error amplifier 4 and lengthens the activation time of the output transistor T1. Such operations keep the output voltage Vo fixed based on the reference power supply e1.

The smoothing capacitor C1 is connected in parallel to the discharge resistor BR to protect the control circuit 2 when the input voltage Vi is interrupted. More specifically, if the current consumption of a load is extremely low or if there is no load on the DC-DC converter 1, the output voltage Vo of the DC-DC converter 1 is kept at a relatively high value for a long period of time by the electric charge stored in the smoothing capacitor C1. In this state, the error amplifier 4 is not supplied with operational power from the power supply circuit 3 due to the interruption of the input voltage Vi. Therefore, voltage higher than the voltage at the power supply terminal is supplied to the input terminal of the error amplifier 4. This may cause a deficiency, such as a latch-up or a burnout, in the error amplifier 4. In order to prevent such a deficiency, the electric charge stored in the smoothing capacitor C1 is discharged via the discharge resistor BR. This readily decreases the output voltage Vo of the DC-DC converter 1 to 0 V.

However, the discharge resistor BR is constantly supplied with current. This lowers the efficiency of the DC-DC converter 1. To avoid this problem, Japanese Patent Laid-Open Publication No. 5-30755 describes a method in which a switch device is connected in series to a discharge resistor RB, and the switch device is activated only when electric charge is discharged from a capacitor. This method, however, requires the switch device and a drive circuit for driving the switch device in addition to the discharge resistor.

FIG. 2 is a schematic block diagram showing a second example of a DC-DC converter 10 in the prior art.

The DC-DC converter 10 includes a control circuit 11, a choke coil L1, a smoothing capacitor C1, and a soft-start capacitor C2. The soft-start capacitor C2 is connected to an inverting input terminal of an error amplifier 4a. The soft-start capacitor C2 is also connected to a constant current source 12 or a resistor R3 via a switch SW of the control circuit 11. When powered on, the control circuit 11 controls the switch SW so that the soft-start capacitor C2 is connected to the constant current source 12. This stores electric charge in the soft-start capacitor C2 in accordance with the current supplied from the constant current source 12. The storage of the electric charge increases the voltage of a soft-start signal SS. When the voltage of the soft-start signal SS is lower than the voltage of a reference power supply e1, the output voltage Vo of the DC-DC converter 10 increases at the same rate as the increase rate of the voltage of the soft-start signal SS. When the voltage of the soft-start signal SS becomes higher than the voltage of the reference power supply e1, the error amplifier 4a amplifies the difference between the voltage of the reference power supply e1 and the output voltage Vo of the DC-DC converter 10. Thus, the output voltage Vo of the DC-DC converter 10 is controlled by the reference power supply e1. In this manner, the gradient of the output voltage during activation of the DC-DC converter 10 is controlled by the voltage of the soft-start signal SS (i.e., the voltage of the capacitor C2) and does not depend on the load of the DC-DC converter 10.

When the DC-DC converter 10 stops operating, the capacitor C2 is connected to the resistor R3 via the switch SW. Accordingly, the electric charge of the capacitor C2 is discharged via the resistor R3. This gradually decreases the voltage of the soft-start signal SS and gradually decreases the output voltage Vo of the DC-DC converter 10. Thus, when the DC-DC converter 10 stops operating, the gradient of the output voltage is controlled by the voltage of the soft-start signal SS (i.e., the voltage of the capacitor C2) and does not depend on the load of the DC-DC converter 10.

Therefore, the DC-DC converter 10 is capable of gradually decreasing the output voltage Vo without depending on the load and without using a discharge resistor or switch device. Japanese Patent Laid-Open Publication Nos. 9-154275 and 10-323026 describe configurations similar to the DC-DC converter of the second prior art example.

SUMMARY OF THE INVENTION

With the DC-DC converter 10 of FIG. 2, the output voltage Vo may gradually be decreased when the input voltage Vi is being supplied. However, if a sudden interruption of the input voltage Vi occurs, the electric charge will remain stored in the smoothing capacitor C1. Hence, voltage higher than the voltage at the power supply terminal will be supplied to the input terminal of the error amplifier 4a. This may cause a deficiency, such as latch-up or burnout, in the error amplifier 4a.

The present invention provides a circuit and method for controlling a DC-DC converter that prevents deficiencies when a sudden interruption of the power supply voltage occurs.

One aspect of the present invention is a DC-DC converter including a main switching transistor for receiving an input voltage. A synchronous rectification transistor is connected in series to the main switching transistor. A choke coil is connected to a node between the main switching transistor and the synchronous rectification transistor. Output voltage of the DC-DC converter is generated at the node based on the input voltage by activating the main switching transistor and the synchronous rectification transistor in a complementary manner. A smoothing capacitor connected to the choke coil smoothes the output voltage. A control circuit, connected to the main switching transistor and the synchronous rectification transistor, inactivates the main switching transistor and activates the synchronous rectification transistor when the input voltage decreases.

Another aspect of the present invention is a control circuit for a DC-DC converter including a main switching transistor for receiving an input voltage, a synchronous rectification transistor connected in series to the main switching transistor, a choke coil connected to a node between the main switching transistor and the synchronous rectification transistor, and a smoothing capacitor connected to the choke coil. The control circuit generates output voltage of the DC-DC converter at the node based on the input voltage by activating the main switching transistor and the synchronous rectification transistor in a complementary manner. The control circuit inactivates the main switching transistor and activates the synchronous rectification transistor when the input voltage decreases.

A further aspect of the present invention is a method for controlling a DC-DC converter including a main switching transistor for receiving an input voltage. A synchronous rectification transistor is connected in series to the main switching transistor. A choke coil is connected to a node between the main switching transistor and the synchronous rectification transistor. A smoothing capacitor is connected to the choke coil. The method includes generating output voltage of the DC-DC converter at the node based on the input voltage by activating the main switching transistor and the synchronous rectification transistor in a complementary manner, and inactivating the main switching transistor and activating the synchronous rectification transistor when the input voltage decreases.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
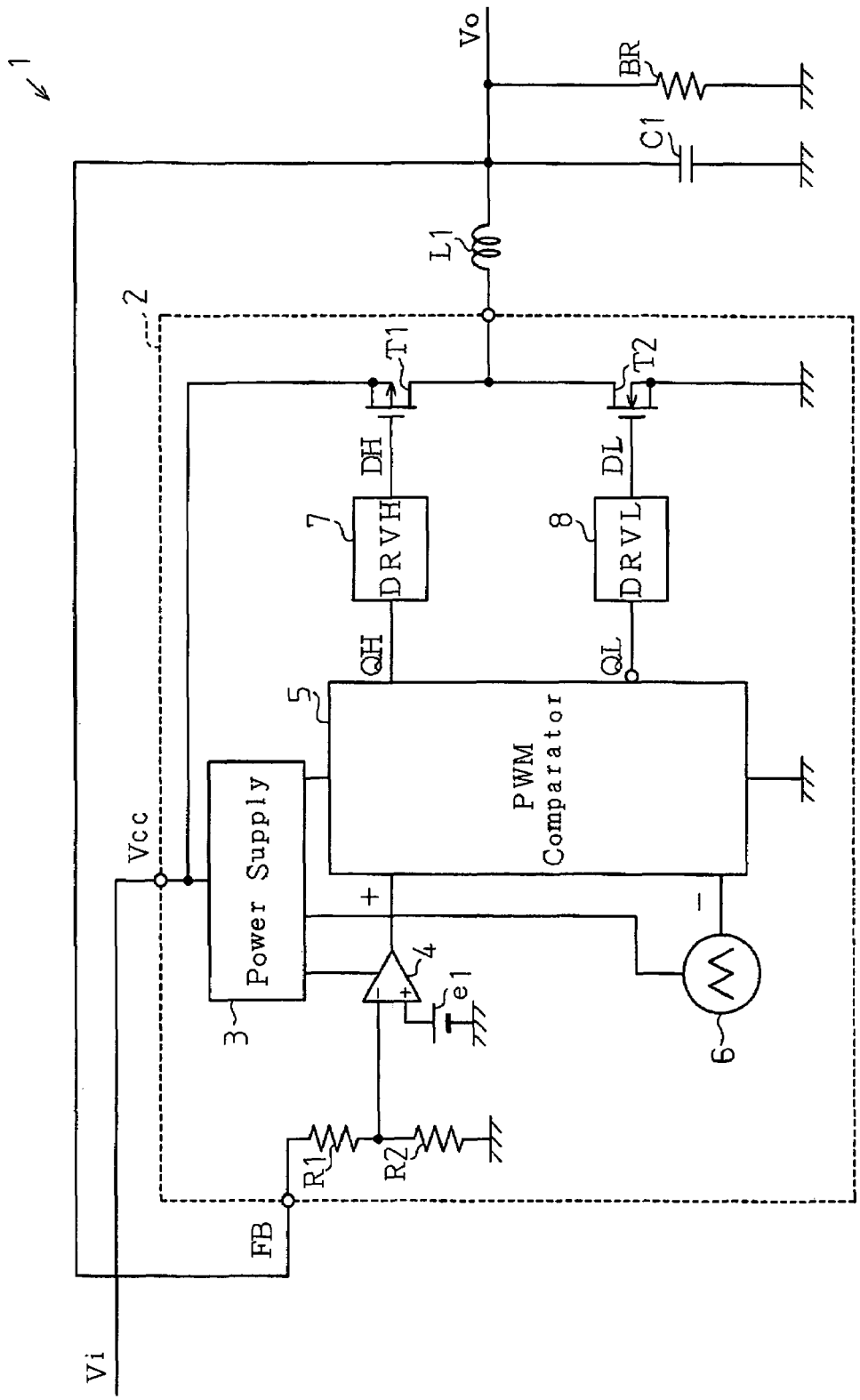
FIG. 1 is a schematic block circuit diagram showing a first example of a DC-DC converter in the prior art.
Figure 2:
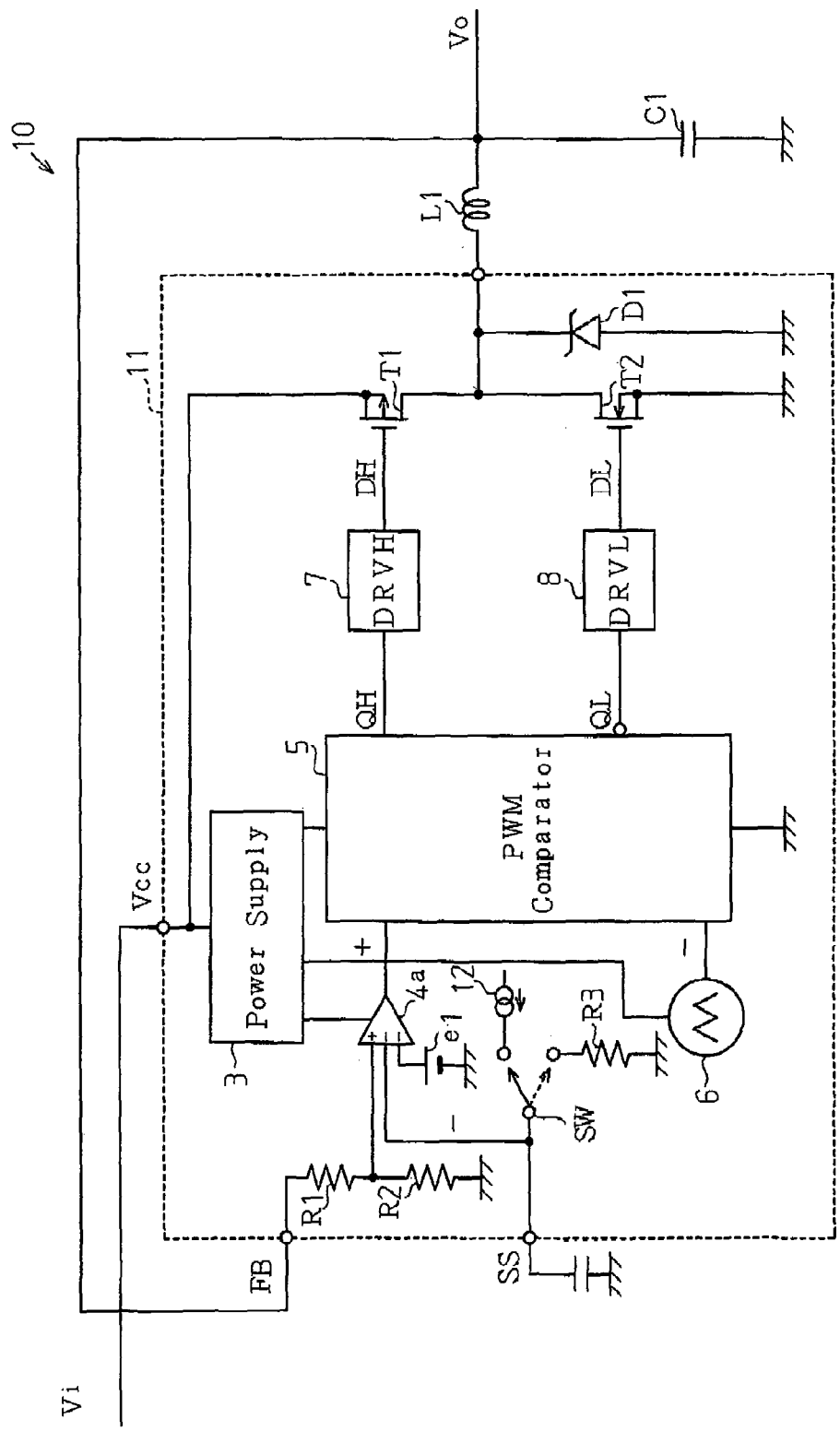
FIG. 2 is a schematic block circuit diagram showing a second example of a DC-DC converter in the prior art.

In the drawings, like numerals are used for like elements throughout.

Figure 3:
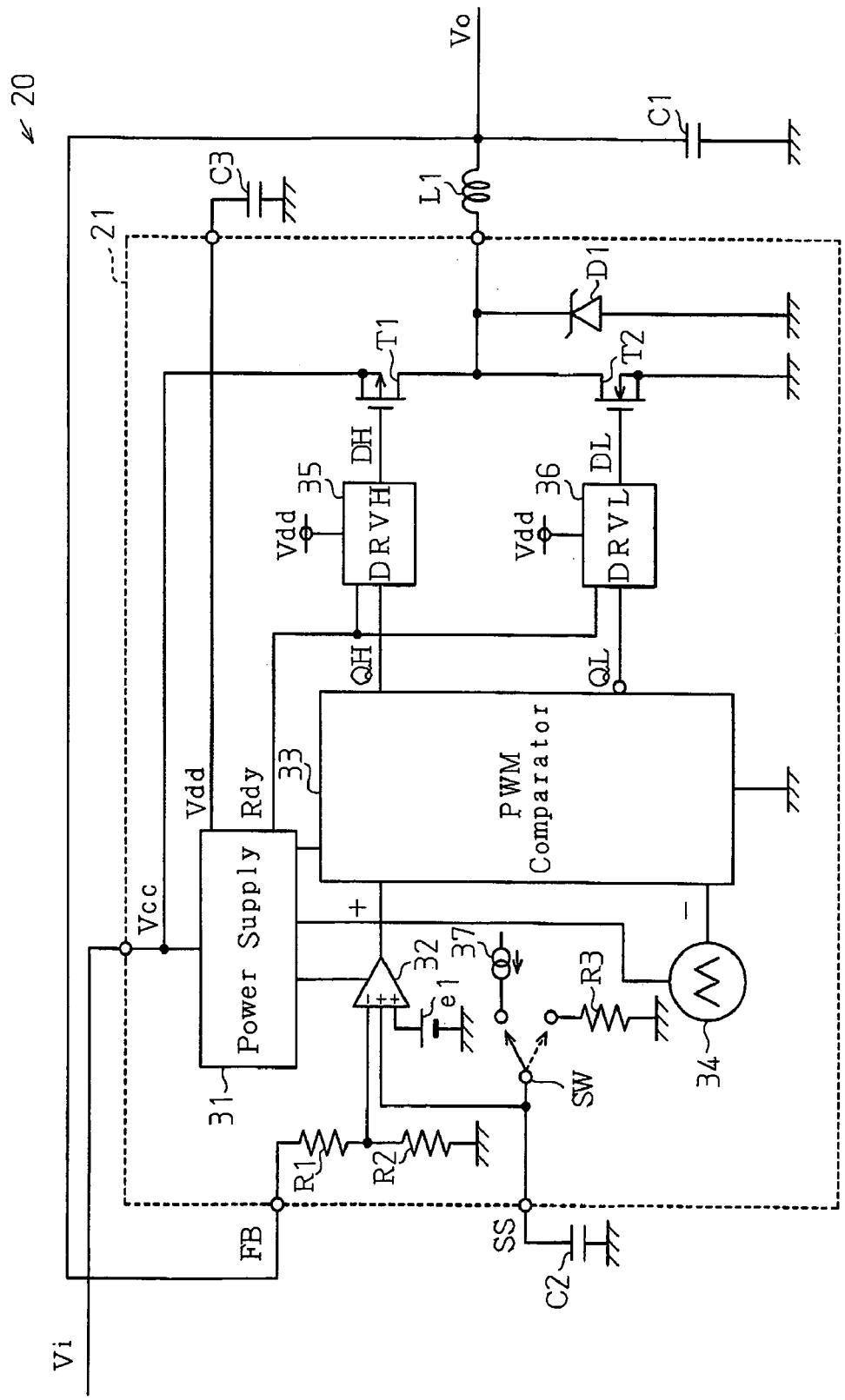
FIG. 3 is a schematic block circuit diagram showing a DC-DC converter according to a first embodiment of the present invention.

A DC-DC converter 20 according to a first embodiment of the present invention will now be described with reference to FIGS. 3 to 5. The DC-DC converter 20 is incorporated in a portable electronic device (e.g., notebook personal computer) to convert an input voltage Vin supplied from a battery to a constant output voltage Vo for operating internal circuits such as a CPU.

The DC-DC converter 20, which is a voltage control DC-DC converter, includes a control circuit 21 formed on a single-chip integrated circuit board, a choke coil L1, a smoothing capacitor C1, a soft-start capacitor C2, and a power supply capacitor C3. The choke coil L1 and capacitors C1, C2 and C3 function as externally connected devices.

The choke coil L1 has a first terminal connected to the output terminal of the control circuit 21 and a second terminal connected to a semiconductor integrated circuit device (not shown), which functions as a load. The control circuit 21 supplies the output voltage Vo to the load via the choke coil L1.

The second terminal of the choke coil L1 is connected to the smoothing capacitor C1, which smoothes the output voltage Vo. The first terminal of the choke coil L1 is connected to the control circuit 21 to supply the control circuit 21 with a feedback signal FB having the voltage of the second terminal, that is, the output voltage Vo. The control circuit 21 is connected to the soft-start capacitor C2 so that a soft-start signal SS having a voltage that is in accordance with the electric charge stored in the capacitor C2 is provided to the control circuit 21.

The control circuit 21 is supplied with input voltage Vi, which functions as a first power supply voltage Vcc. The control circuit 21 is connected to the power supply capacitor C3 so that the control circuit 21 is supplied with a second power supply voltage Vdd that is in accordance with the electric charge stored in the capacitor C3.

The control circuit 21 includes a power supply circuit 31, an error amplifier 32, a PWM comparator 33, a triangular wave oscillator 34, a drive circuit (DRVH) 35, a drive circuit (DRVL) 36, a constant current source 37, an output transistor T1 functioning as a main switching transistor, an output transistor T2 functioning as a synchronous rectification transistor, resistors R1, R2 and R3, a reference power supply e1, and a diode D1.

The power supply circuit 31, which receives the input voltage Vi as the first power supply voltage Vcc, is connected to the power supply capacitor C3. The power supply circuit 31 generates, from the first power supply voltage Vcc, operational power for the error amplifier 32, the PWM comparator 33, and the triangular wave oscillator 34. The power supply circuit 31 monitors the first power supply voltage Vcc to generate a control signal Rdy that is in accordance with the monitoring result. When supplied with the first power supply voltage Vcc, the power supply circuit 31 charges the power supply capacitor C3, while supplying the first power supply voltage Vcc to the first and second drive circuits 35 and 36 as a second power supply voltage Vdd. When the first power supply voltage Vcc is interrupted, the power supply circuit 31 supplies the first and second drive circuits 35 and 36 with the second power supply voltage Vdd, which is in accordance with the electric charge stored in the capacitor C3.

The resistors R1 and R2 function as a voltage dividing circuit for dividing the feedback signal FB to generate a divided voltage. The error amplifier 32 has first and second non-inverting input terminals and an inverting input terminal. The error amplifier 32 generates an output voltage based on a potential difference between the input voltage at the inverting input terminal and a lower one of the input voltage at the first and second non-inverting input terminals. Accordingly, if the voltage at the first or second non-inverting input terminal is higher than the voltage at the inverting input terminal, the output voltage of the error amplifier 32 is increased in accordance with the potential difference. If the voltage at the first or second non-inverting input terminal is lower than the voltage at the inverting input terminal, the output voltage of the error amplifier 32 is decreased in accordance with the potential difference.

The first non-inverting input terminal of the error amplifier 32 is connected to a switch SW and the capacitor C2 so that the first non-inverting input terminal is supplied with the soft-start signal SS having voltage that is in accordance with the electric charge stored in the capacitor C2. The second non-inverting input terminal of the error amplifier 32 is connected to the reference power supply e1. The inverting input terminal of the error amplifier 32 is connected to a node between the resistors R1 and R2. The divided voltage of the feedback signal FB (i.e., the divided voltage of the output voltage Vo) is supplied to the node. Accordingly, the error amplifier 32 generates output voltage in accordance with the comparison result of the voltage of the divided voltage of the output voltage Vo and either the voltage of the soft-start signal SS or the reference power supply e1.

The switch SW has a common terminal connected to the error amplifier 32, a first terminal connected to the constant current source 37, and a second terminal connected to ground via the resistor R3. When the common terminal and the first terminal are connected, electric charge is stored in the capacitor C2 by current from the constant current source 37. This increases the voltage of the soft-start signal SS. When the common terminal and the second terminal are connected, the electric charge stored in the capacitor C2 is discharged via the resistor R3. This decreases the voltage of the soft-start signal SS.

The PWM comparator 33 has a non-inverting input terminal for receiving the output voltage of the error amplifier 32 and an inverting input terminal for receives a triangular wave signal from the triangular wave oscillator 34. The PWM comparator 33 compares the output signal of the error amplifier 32 with the triangular wave signal of the triangular wave oscillator 34. When the output voltage of the error amplifier 32 is higher than voltage of the triangular wave signal generated by the triangular wave oscillator 34, the PWM comparator 33 generates an output signal QH having an H level and an output signal QL having an L level. When the output voltage of the error amplifier 32 is lower than the triangular wave signal voltage of the triangular wave oscillator 34, the PWM comparator 33 generates the output signal QH at an L level and the output signal QL at an H level.

The drive circuit (DRVH) 35, which operates based on the second power supply voltage Vdd, converts the voltage level of the output signal QH of the PWM comparator 33 to generate a control signal DH provided to the gate of the output transistor T1. The drive circuit (DRVL) 36, which operates based on the second power supply voltage Vdd, converts the voltage level of the output signal QL of the PWM comparator 33 to generate a control signal DL provided to the gate of the output transistor T2. The output transistor T1 is a P-channel MOS transistor having a source, which receives the input voltage Vi. The output transistor T2 is an N-channel MOS transistor having a source connected to the low-potential power supply (ground). The output transistor T1 is activated in response to an L level control signal DH, and the output transistor T2 is activated in response to an H level control signal DL.

A node between the output transistors T1 and T2 is connected to ground via the diode D1. The node is also connected to the choke coil L1.

Figure 4:
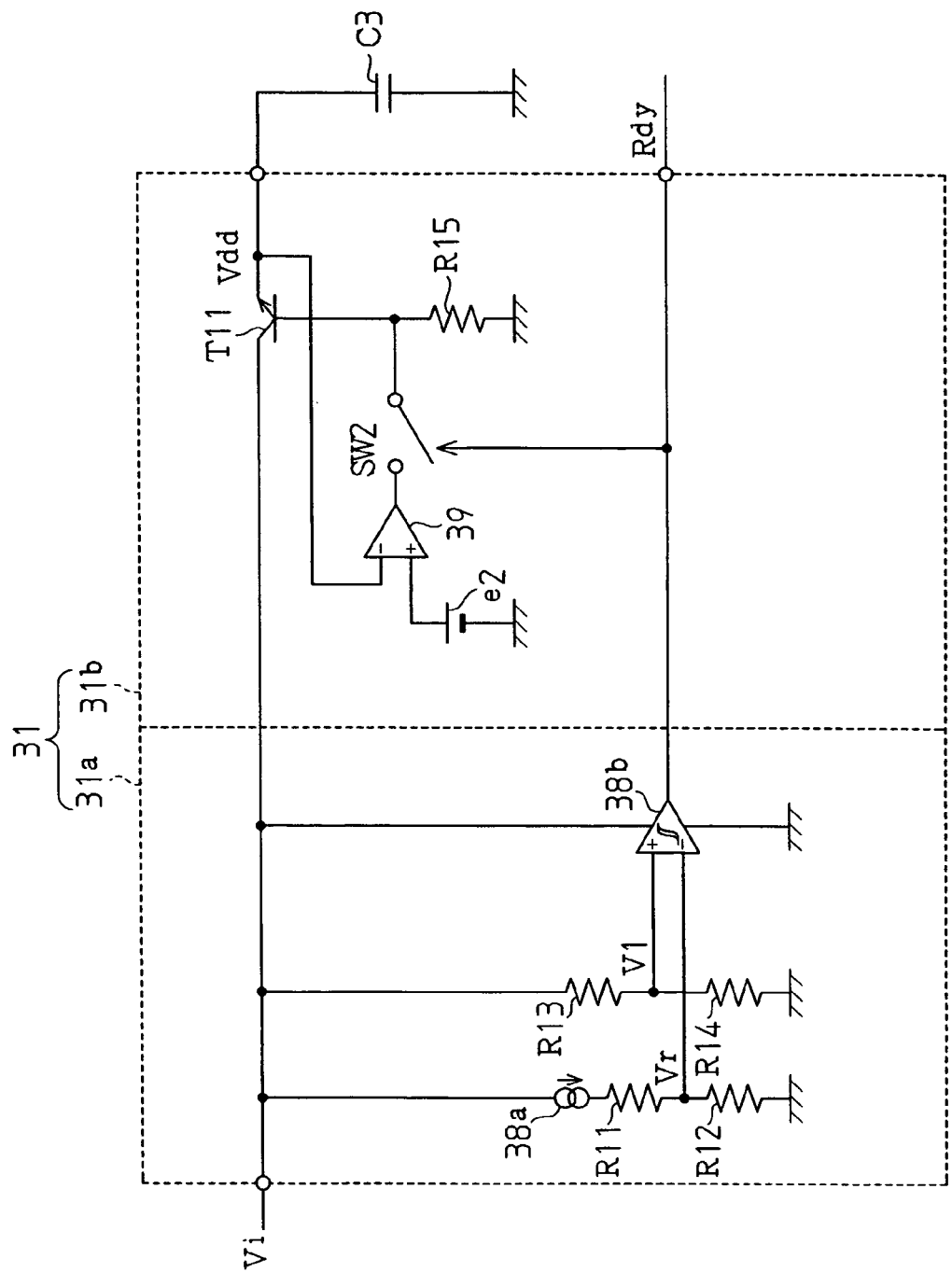
FIG. 4 is a schematic block circuit diagram of a power supply circuit in the DC-DC converter of FIG. 3.

As shown in FIG. 4, the power supply circuit 31 includes an input voltage detector 31a and a power supply 31b. The input voltage detector 31a includes a constant current source 38a, a voltage comparator 38b, and four resistors R11, R12, R13, and R14. The constant current source 38a receives the input voltage Vi and supplies the resistor R11 with constant current. The resistor R11 and the resistor R12, which are series-connected, generate reference voltage Vr based on the current supplied from the constant current source 38a. The resistor R13 has a first terminal receiving the input voltage Vi and a second terminal connected to the first terminal of the resistor R14. The second terminal of the resistor R14 is connected to ground. Accordingly, the resistors R13 and R14 divide the input voltage Vi to generate a divided voltage V1.

The voltage comparator 38b has a non-inverting input terminal for receiving the divided voltage V1 and an inverting input terminal for receiving the reference voltage Vr. The voltage comparator 38b compares the divided voltage with the reference voltage to generate the control signal Rdy at an H level when the divided voltage is higher than the reference voltage and generate the control signal Rdy at an L level when the divided voltage is lower than the reference voltage.

The current value of the constant current source 38a and the resistance values of the resistors R11 to R14 are set based on the input voltage Vi and the operable voltage of the DC-DC converter 20. More specifically, the current value of the constant current source 38a and the resistance values of the resistors R11 to R14 are set such that, when the input voltage Vi is higher than the operable voltage of the DC-DC converter 20, the reference voltage Vr, which is generated by the constant current source 38a and the resistors R11 and R12, is lower than the divided voltage V1, which is generated by the resistors R13 and R14. Accordingly, the voltage comparator 38b generates an H level control signal Rdy when the input voltage Vi of the DC-DC converter 20 is higher than the operable voltage of the DC-DC converter. The voltage comparator 38b generates an L level control signal Rdy when the input voltage Vi of the DC-DC converter 20 is lower than the operable voltage of the DC-DC converter 20.

The power supply 31b includes a transistor T11, an error amplifier 39, a reference power supply e2, a switch SW2, and a resistor R15. The transistor T11 functions as a switch device.

The transistor T11 is an NPN transistor having a collector for receiving the input voltage Vi, a base connected to ground via the resistor R15, and an emitter connected to the capacitor C3. The error amplifier 39 has an inverting input terminal connected to the capacitor C3, a non-inverting input terminal, which is connected to the reference power supply e2, and an output terminal, which is connected to a node between the transistor T11 and the resistor R15 via the switch SW2. Activation and inactivation of the switch SW2 is controlled by the control signal Rdy. The amplifier 39 amplifies the difference between the voltage of the reference power supply e2 and the voltage at the node between the transistor T11 and the capacitor C3 to generate an amplified error signal. The voltage of the reference power supply e2 is set to the input voltage Vi.

The switch SW2 is activated in response to an H level control signal Rdy and inactivated in response to an L level control signal Rdy. In other words, the switch SW2 is activated when the input voltage Vi is higher than the operable voltage and inactivated when the input voltage Vi is lower than the operable voltage.

When the switch SW2 is activated, the voltage (node voltage) of the amplified error signal of the amplifier 39 is applied to the base of the transistor T11. Accordingly, the transistor T11 is inactivated when the node voltage is higher than the reference power supply e2 and activated when the node voltage is lower than the voltage of the reference power supply e2. When the transistor T11 is activated, the input voltage Vi is supplied to the capacitor C3 via the transistor T11, and the input voltage Vi is supplied to the first and second drive circuits 35 and 36 as the second power supply voltage Vdd. The capacitor C3 stores the electric charge in accordance with the input voltage Vi. When the transistor T11 is inactivated, the second power supply voltage Vdd, which is in accordance with the electric charge stored in the capacitor C3, is supplied to the first and second drive circuits 35 and 36.

When the switch SW2 is inactivated, the base of the transistor T11 is grounded via the resistor R15. This inactivates the transistor T11 and supplies the first and second drive circuits 35 and 36 with the second power supply voltage Vdd, which is in accordance with the electric charge stored in the capacitor C3.

Figure 5:
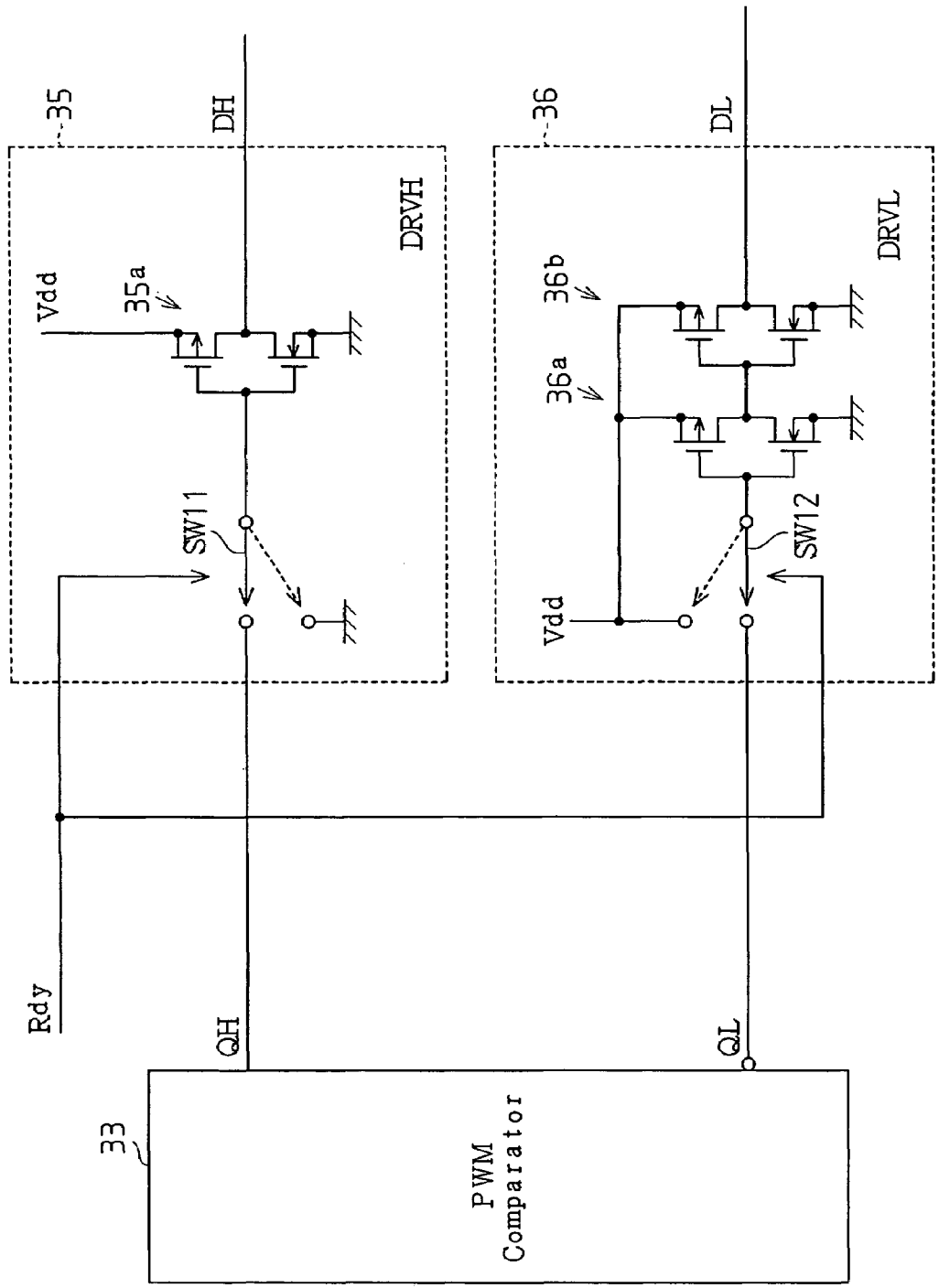
FIG. 5 is a schematic block circuit diagram of a drive circuit in the DC-DC converter of FIG. 3.

As shown in FIG. 5, the drive circuit 35 includes a switch SW11 and an inverter circuit 35a. The switch SW11 has a common terminal connected to the input terminal of the inverter circuit 35a, a first terminal connected to the PWM comparator 33, and a second terminal connected to the ground. The output terminal of the inverter circuit 35a is connected to the gate of the output transistor T1 shown in FIG. 3.

The switch SW11 connects the common terminal to the first terminal, in response to an H level control signal Rdy, and connects the common terminal to the second terminal, in response to an L level control signal Rdy. The inverter circuit 35a includes a P-channel MOS transistor and an N-channel MOS transistor, which are connected in series to each other. The source of the P-channel MOS transistor is supplied with the second power supply voltage Vdd, and the source of the N-channel MOS transistor is connected to ground.

When the control signal Rdy has an H level, the output signal QH of the PWM comparator 33 is provided to the input terminal of the inverter circuit 35a. When the control signal Rdy has an L level, the input terminal of the inverter circuit 35a is connected to ground. When the control signal Rdy has an H level, the inverter circuit 35a generates the control signal DH at the level of the second power supply voltage Vdd or at the ground level, of which logics are reversed from the logic of the output signal QH. When the control signal Rdy has an L level, the inverter circuit 35a generates the control signal DH at the level of the second power supply voltage Vdd.

As shown in FIG. 5, the drive circuit 36 includes a switch SW12 and two inverter circuits 36a and 36b. The switch SW12 has a first terminal connected to the PWM comparator 33, a second terminal connected to the second power supply Vdd, and a common terminal connected to the input terminal of the first inverter circuit 36a. The output terminal of the first inverter circuit 36a is connected to the input terminal of the second inverter circuit 36b. The output terminal of the second inverter circuit 36b is connected to the gate of the output transistor T2 shown in FIG. 3.

The switch SW12 connects the common terminal to the first terminal, in response to an H level control signal Rdy, and connects the common terminal to the second terminal, in response to an L level control signal Rdy. Each of the inverter circuits 36a and 36b includes a P-channel MOS transistor and an N-channel MOS transistor, which are connected in series to each other. The source of the P-channel MOS transistor is supplied with the second power supply voltage Vdd, and the source of the N-channel MOS transistor is connected to the ground.

When the control signal Rdy has an H level, the output signal QL of the PWM comparator 33 is provided to the input terminal of the first inverter circuit 36a. When the control signal Rdy is L level, the second power supply voltage Vdd is provided to the input terminal of the first inverter circuit 36a. When the control signal Rdy has an H level, the inverter circuits 36a and 36b generate a control signal DL at the level of the second power supply voltage Vdd or at ground level, of which logics are the same as the output signal QL. When the control signal Rdy has an L level, the inverter circuits 36a and 36b generate the control signal DL at the level of the second power supply voltage Vdd.

In the DC-DC converter 20, the input voltage detector 31a generates an H level control signal Rdy when the input voltage Vi is higher than the operable voltage of the DC-DC converter 20. Accordingly, the power supply 31b provides the first and second drive circuits 35 and 36 with the second power supply voltage Vdd having substantially the same voltage as the input voltage Vi in response to the H level control signal Rdy.

When powered on, the control circuit 21 controls the switch SW to connect the soft-start capacitor C2 to the constant current source 37. As a result, electric charge is stored in the soft-start capacitor C2 in accordance with current supplied from the constant current source 37. Further, the voltage of the soft-start signal SS is increased as the electric charge is stored. When the voltage of the soft-start signal SS, which increases as the time elapses, is lower than the voltage of the reference power supply e1, the output voltage Vo of the DC-DC converter 20 increases at substantially the same rate as the increase rate of the voltage of the soft-start signal SS. When the voltage of the soft-start signal SS becomes higher than the voltage of the reference power supply e1, the error amplifier 32 amplifies the difference between the voltage of the reference power supply e1 and the output voltages Vo of the DC-DC converter 20. The output voltage Vo of the DC-DC converter 20 is controlled by the reference power supply e1 in this manner. Consequently, the gradient of the output voltage during activation of the DC-DC converter 20 is controlled by the voltage of the soft-start signal SS, or the voltage of the capacitor C2, and does not depend on the load of the DC-DC converter 20.

The PWM comparator 33 generates the output signal QH, which has a pulse waveform that is in accordance with the comparison result between the triangular wave signal of the triangular wave oscillator 34 and the amplified error signal of the error amplifier 32, and the output signal QL, which is complementary to the output signal QH. The first drive circuit 35 provides, in response to an H level control signal Rdy, the output transistor T1 with a control signal DH having logic reversed from that of the output signal QH. The second drive circuit 36 provides, in response to an H level control signal Rdy, the output transistor T2 with a control signal DL having the same logic as the output signal QL. The output transistor T1 is a P-channel MOS transistor, and the output transistor T2 is an N-channel MOS transistor. Accordingly, the control signals DH and DL activate and inactivate the output transistors T1 and T2 in a complementary manner.

The activation of the output transistor T1 increases the output voltage Vo. The output voltage Vo is smoothed by the smoothing capacitor C1. When the output transistor T1 is inactivated, the energy stored in the choke coil L1 is discharged. Decrease in the energy stored in the choke coil L1 decreases the output voltage Vo. When the divided voltage generated by the resistors R1 and R2 becomes lower than the reference power supply voltage e1, the output transistor T1 is activated.

Increase in the output voltage Vo decreases the output voltage of the error amplifier 32 and shortens the activation time of the output transistor T1. Decrease in the output voltage Vo increases the output voltage of the error amplifier 32 and lengthens the activation time of the output transistor T1. Such operations maintain the output voltage Vo at a constant voltage based on the reference power supply voltage e1.

When the DC-DC converter 20 stops operating, the capacitor C2 is connected to the resistor R3 via the switch SW. Thus, the electric charge of the capacitor C2 is discharged via the resistor R3, and the voltage of the soft-start signal SS gradually decreases. The gradual decrease in the voltage of the soft-start signal SS causes the output voltage Vo of the DC-DC converter 20 to gradually decrease. Thus, when the DC-DC converter 20 stops operating, the gradient of the output voltage is controlled by the voltage of the soft-start signal SS, or the voltage of the capacitor C2, and does not depend on the load of the DC-DC converter 20.

For example, when the input voltage Vi is suddenly interrupted and the input voltage Vi becomes lower than the operable voltage of the DC-DC converter 20, the input voltage detector 31a generates an L level control signal Rdy. In response to the L level control signal Rdy, the power supply 31b inactivates the transistor T11 and supplies the second power supply voltage Vdd to the first and second drive circuits 35 and 36 with the electric charge stored in the capacitor C3.

In response to the L level control signal Rdy, the first drive circuit 35 provides the output transistor T1 with the control signal DH at the level of the second power supply voltage Vdd. In response to the L level control signal Rdy, the second drive circuit 36 provides the output transistor T2 with the control signal DL at the level of the second power supply voltage Vdd. Thus, the output transistor T2 is activated, and the electric charge stored in the capacitor C1 is discharged via the activated output transistor T2. The discharge readily decreases the voltage of the smoothing capacitor C1 to 0 V (zero volts). The electric charge stored in the capacitor C1 prevents the potential at the drain of the output transistor T1 from being higher than the potential at the source of the output transistor T1. The output transistor T1, which is inactivated by the control signal DH having the level of the second power supply voltage Vdd, prevents the current from flowing through the capacitor C3.

The DC-DC converter 20 of the first embodiment has the advantages described below.

(1) The control circuit 21 activates the synchronous rectification output transistor T2 when the input voltage Vi decreases to readily discharge the electric charge stored in the smoothing capacitor C1. This prevents the electric charge stored in the smoothing capacitor C1 from causing a deficiency such as latch-up or burnout. In comparison with when a discharge resistor is connected in parallel to the smoothing capacitor C1, the resistance value of the activated output transistor T2 is lower than the resistance value of the discharge resistor. This shortens the discharge time.

(2) The power supply circuit 31 charges the power supply capacitor C3 based on the input voltage Vi to generate the second power supply voltage Vdd in accordance with the electric charge stored in the power supply capacitor C3 when the input voltage Vi decreases. If the input voltage Vi is interrupted, the first drive circuit 35 is operated by the second power supply voltage Vdd to inactivate the main switching output transistor T1, and the second drive circuit 36 activates the synchronous rectification output transistor T2. Accordingly, the output transistor T2 is held in the activated state until the smoothing capacitor C1 discharges its electric charge. This ensures that electric charge is discharged from the smoothing capacitor C1.

(3) The error amplifier 32 of the control circuit 21 compares the divided voltage of the output voltage Vo with the voltage of the reference power supply e1 and the amplified error signal of the error amplifier 32 with the triangular wave signal of the triangular wave oscillator 34 to generate first and second complementary output signals QH and QL in accordance with the comparison result. The first drive circuit 35 provides the output transistor T1 with the first control signal DH generated based on the first output signal QH. The second drive circuit 36 provides the output transistor T2 with the second control signal DL generated based on the second output signal QL. The error amplifier 32, the PWM comparator 33, and the triangular wave oscillator 34 are operated by the first power supply voltage Vcc (input voltage Vi). The first and second drive circuits 35 and 36 are operated by the second power supply voltage Vdd. Consequently, the second power supply voltage Vdd generated by the electric charge stored in the power supply capacitor C3 is supplied only to limited circuits. This increases the time during which the second power supply voltage Vdd is continuously supplied and holds the output transistor T2 in an activated state until the smoothing capacitor C1 is discharged. Thus, the discharging of the smoothing capacitor C1 is ensured.

(4) The voltage detector 31a of the power supply circuit 31 detects the input voltage Vi and generates the control signal Rdy based on the detection result. The input voltage detector 31a of the power supply circuit 31 includes the transistor T11, which is arranged in the path for supplying the input voltage Vi to the power supply capacitor C3. In response to the control signal Rdy, the input voltage detector 31a activates the transistor T11 when the input voltage Vi is higher than the operable voltage to charge the power supply capacitor C3. When the input voltage Vi is lower than the operable voltage, the input voltage detector 31a inactivates the transistor T11. This ensures detection of a decrease in the input voltage Vi. Additionally, the power supply capacitor C3 can be charged reliably when the input voltage Vi is higher than the operable voltage. When the input voltage Vi is lower than the operable voltage, the transistor T11 is inactivated, the discharge of electric charge from the power supply capacitor C3 to the transistor T11 is decreased, and the time during which the second power supply voltage Vdd is continuously supplied is lengthened.

Figure 6:
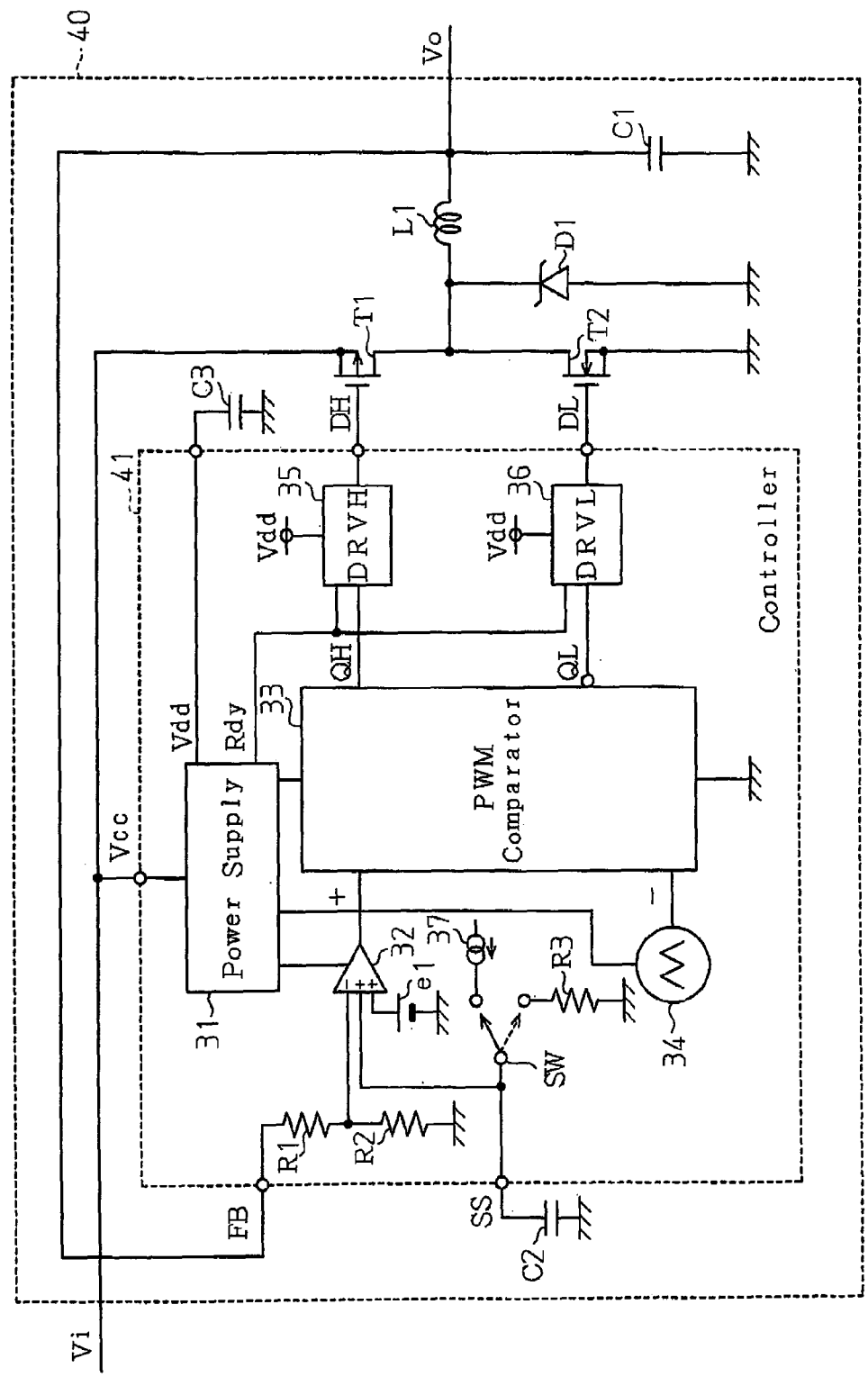
FIG. 6 is a schematic block circuit diagram showing a DC-DC converter according to second embodiment of the present invention.

A DC-DC converter 40 according to a second embodiment of the present invention will now be described with reference to FIG. 6.

The DC-DC converter 40 includes a control circuit 41 formed on a single-chip integrated circuit board. The DC-DC converter 40 further includes output transistors T1 and T2, a choke coil L1, a smoothing capacitor C1, a soft-start capacitor C2, and a power supply capacitor C3, each of which functions as an externally connected device. Unlike the control circuit 2 of the first embodiment, the control circuit 41 of the second embodiment does not have the output transistors T1 and T2. In the second embodiment, the output transistors T1 and T2 are connected to the control circuit 41 as the externally connected devices. Accordingly, the DC-DC converter 40 of the second embodiment has the same advantages as the DC-DC converter 20 of the first embodiment.

Figure 7:
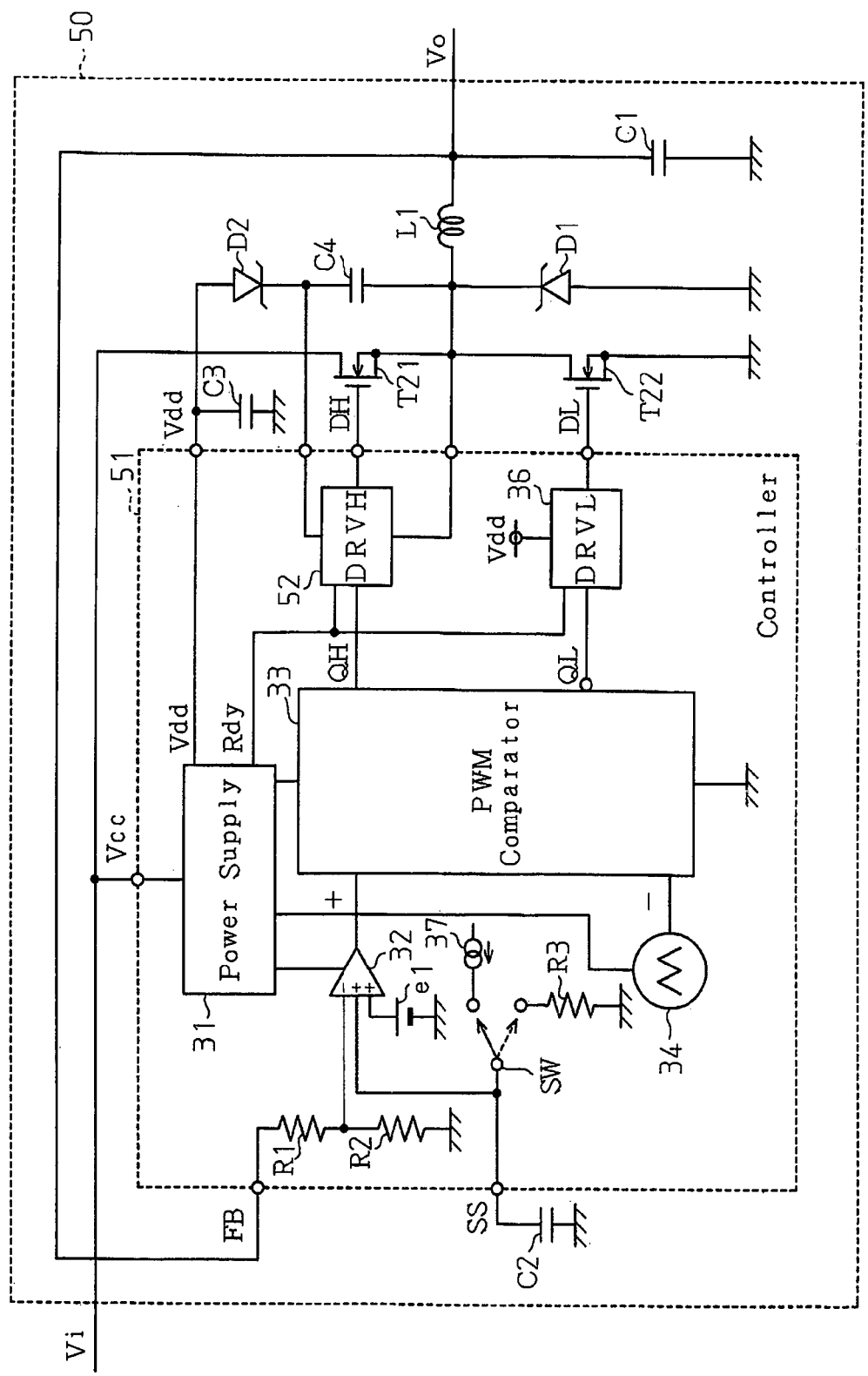
FIG. 7 is a schematic block circuit diagram showing a DC-DC converter according to a third embodiment of the present invention.

A DC-DC converter 50 according to a third embodiment of the present invention will now be described with reference to FIGS. 7 and 8.

The DC-DC converter 50 includes a control circuit 51 formed on a single-chip integrated circuit board. The DC-DC converter 50 further includes an output transistor (main switching transistor) T21, an output transistor (synchronous rectification transistor) T22, a choke coil L1, a smoothing capacitor C1, a soft-start capacitor C2, power supply capacitors C3 and C4, and diode D1 and D2, each of which functions as an externally connected device.

The output transistors T21 and T22 are both N-channel MOS transistors. The on resistance is decreased by configuring the output transistor T21 with an N-channel MOS transistor. This reduces power loss. The DC-DC converter 50 of the third embodiment is configured to drive the output transistor T21, which is an N-channel MOS transistor.

When an N-channel MOS transistor is employed as the output transistor T21 of the DC-DC converter 50, the first control signal DH for driving the transistor T21 is required to have a voltage higher than the input voltage Vi. Therefore, when activating and inactivating the output transistor T21, the DC-DC converter 50 varies the source potential of the output transistor T21 between the ground potential and the input voltage Vi and increases the input voltage Vi with a charge pump to generate voltage for driving the transistor T21.

More specifically, the output signal QH of the PWM comparator 33 is provided to the gate of the output transistor T21 via the first drive circuit 52 as the first control signal DH. The output signal QL is provided to the gate of the output transistor T22 via the second drive circuit 36 as a second control signal DL.

The capacitor C4 has a first terminal connected to the cathode of the diode D2 and a second terminal connected to the source of the output transistor T21. The anode of the diode D2 is connected to ground via the capacitor C3. The first terminal of the capacitor C4 is connected to a low-potential power supply terminal of the first drive circuit 52. The second terminal of the capacitor C4 is connected to a high-potential power supply terminal of the first drive circuit 52.

Figure 8:
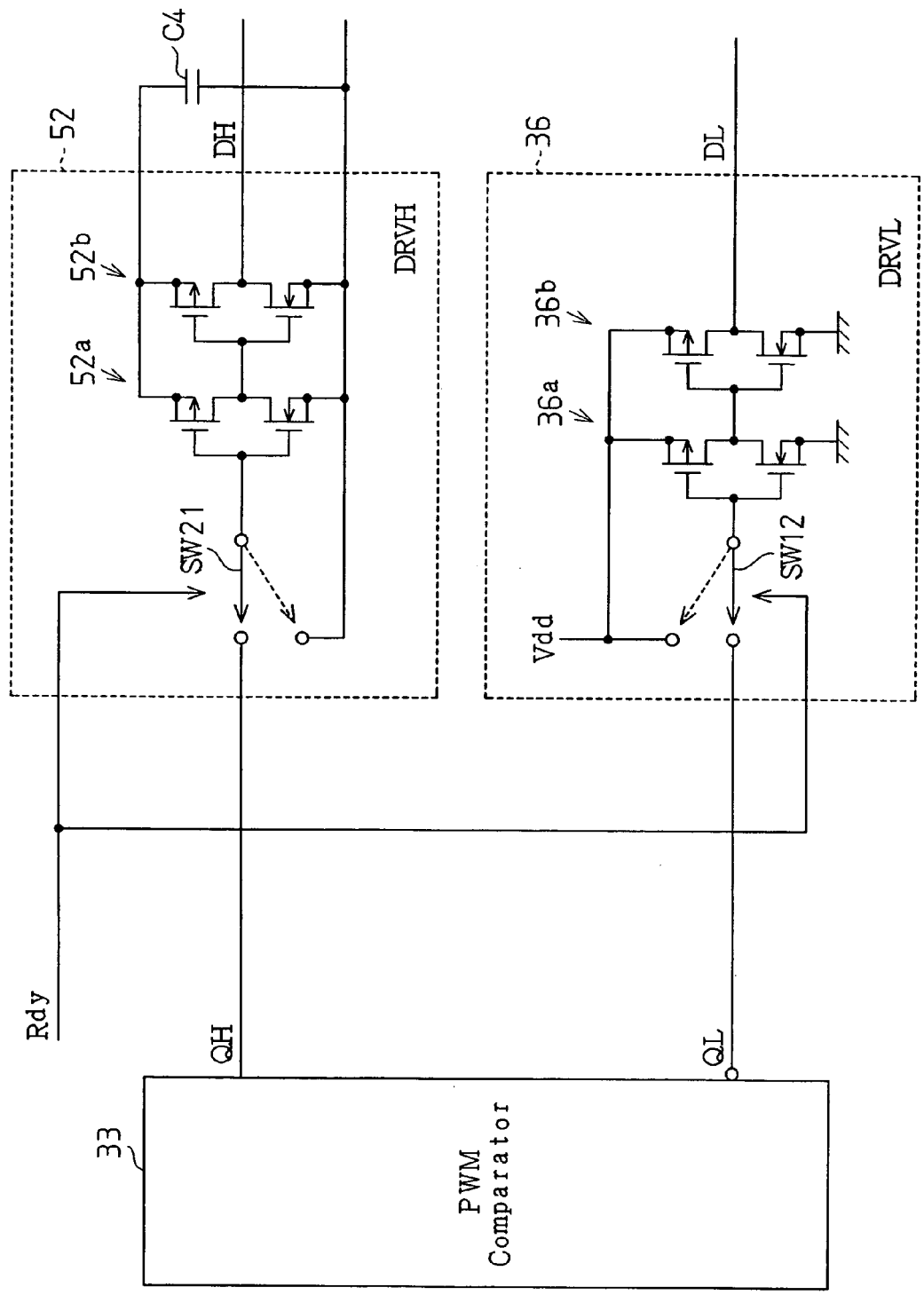
FIG. 8 is a schematic block circuit diagram of a drive circuit in the DC-DC converter of FIG. 7.

As shown in FIG. 8, the first drive circuit 52 includes a switch SW21 and two inverter circuits 52a and 52b. The output terminal of the first inverter circuit 52a is connected to the input terminal of the second inverter circuit 52b. The output terminal of the second inverter circuit 52b is connected to the gate of the output transistor T21 shown in FIG. 7.

Each of the inverter circuits 52a and 52b is configured by a P-channel MOS transistor and an N-channel MOS transistor, which are connected in series to each other. The capacitor C4 is connected between the source of the P-channel MOS transistor and the source of the N-channel MOS transistor.

In the DC-DC converter 50, the source of the output transistor T21 is set to the ground potential when the output transistor T21 is inactivated and the output transistor T22 is activated. In this state, current flows to the capacitor C4 via the diode D2, and the capacitor C4 is charged until a voltage equal to the second power supply voltage Vdd is obtained. Subsequently, the control signal DH is output from the first drive circuit 52 by using the charge voltage of the capacitor C4 to activate the output transistor T21.

When the output transistor T21 is activated, the source potential of the transistor T21 increases to the input voltage Vi. Since the capacitor C4 is connected to the source of the transistor T21, the voltage supplied from the capacitor C4 to the first drive circuit 52 also increases and is set to be higher than the input voltage Vi. Even if the source potential of the transistor T21 increases, the voltage of the first control signal DH does not vary relative to the source potential and is kept at the level of the input voltage Vi. The output transistor T21 is thus driven by the first control signal DH. The diode D2 functions as a reverse flow prevention circuit which prevents the electric charge of the capacitor C4 that is set to a higher voltage than the second power supply voltage Vdd from reversely flowing to the capacitor C3.

In addition to the advantages of the DC-DC converter 20 of the first embodiment, the DC-DC converter 50 of the third embodiment has the advantages described below.

The power supply capacitor C4 lowers the on resistance of the output transistor T21, which is configured by an N-channel MOS transistor, and functions as a capacitor for reducing power loss. This minimizes the number of externally connected components and prevents the surface area of the DC-DC converter 50 from increasing.

Figure 9:
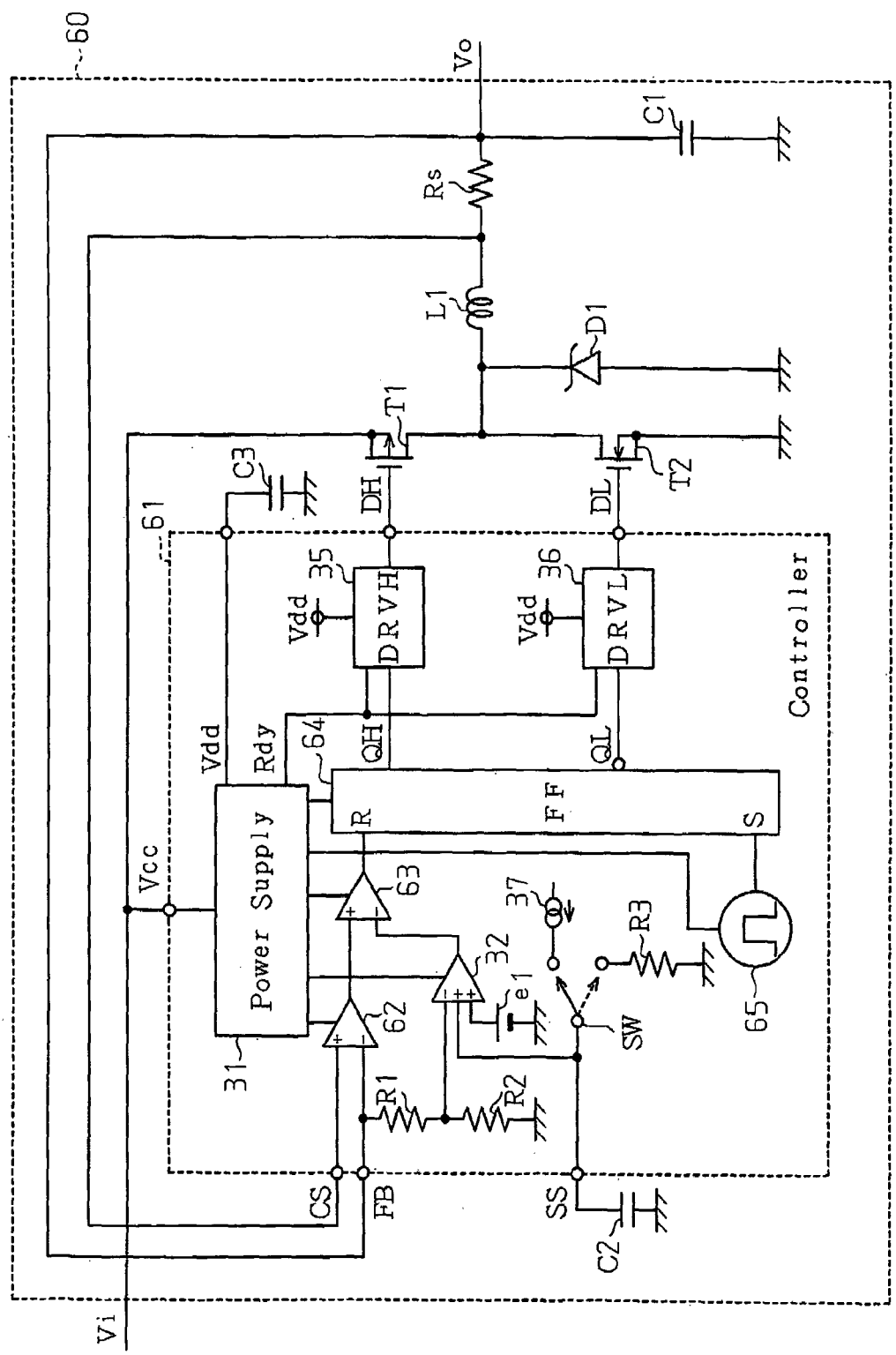
FIG. 9 is a schematic block circuit diagram showing a DC-DC converter according to a fourth embodiment of the present invention.

A DC-DC converter 60 according to a fourth embodiment of the present invention will now be described with reference to FIG. 9.

The DC-DC converter 60 is a current control mode DC-DC converter and includes a control circuit 61 formed on a single-chip integrated circuit board. The DC-DC converter 60 further includes output transistors T1 and T2, a choke coil L1, a smoothing capacitor C1, a soft-start capacitor C2, a power supply capacitor C3, a diode D1, and a current detection resistor Rs, each functioning as an external element. Output voltage Vo of the DC-DC converter 60 is output via the current detection resistor Rs.

The voltage amplifier 62 of the control circuit 61 is supplied with the voltages at the two terminals of the current detection resistor Rs. The voltages at the two terminals of current detection resistor Rs are generated based on output current flowing through the current detection resistor Rs. The voltage amplifier 62 amplifies the voltages generated at the two terminals of the current detection resistor Rs and provides an amplified signal to the comparator 63. The error amplifier 32 of the control circuit 61 amplifies the differential voltage between the voltage of the reference power supply e1 and the voltage obtained by dividing the output voltage Vo with the resistors R1 and R2. Then, the error amplifier 32 provides the amplified error signal to the comparator 63.

The comparator 63 compares the voltage of the amplified signal from the voltage amplifier 62 with the voltage of the amplified error signal from the error amplifier 32. When the voltage of the amplified signal from the voltage amplifier 62 is higher than the voltage of the amplified error signal from the error amplifier 32, the comparator 63 applies an H level output signal to a reset terminal R of a flipflop circuit (FF circuit) 64. When the voltage of the amplified signal from the voltage amplifier 62 is lower than the voltage of the amplified error signal from the error amplifier 32, the comparator 63 applies an L level output signal to the reset terminal R.

An oscillator 65 provides a set terminal S of the FF circuit 64 with a pulse signal having a constant frequency. When the set terminal S is provided with an H level signal, the FF circuit 64 generates an H level output signal QH at an output terminal Q, and generates an L level output signal QL at an inverting output terminal Q/. When the reset terminal R is provided with an H level signal, the FF circuit 64 generates an L level output signal QH and an H level output signal QL.

The control circuit 61 activates the output transistor T1 in constant cycles in response when the pulse signal of the oscillator 65 rises. When the output transistor T1 is activated, current IL flowing through the choke coil L1 and the current detection resistor Rs increases, and the voltage of the amplified signal from the voltage amplifier 62 increases. When the voltage of the amplified signal from the voltage amplifier 62 is higher than the voltage of the amplified error signal from the error amplifier 32, an H level output signal is applied to the reset terminal R of the FF circuit 64. This inactivates the output transistor T1, activates the output transistor T2, and discharges the energy stored in the choke coil L1.

If the output voltage Vo decreases during the activation and inactivation of the output transistors T1 and T2, the voltage of the amplified error signal from the error amplifier 32 increases. Further, the period during which the comparator 63 outputs an L level output signal is lengthened, and the activation time of the output transistor T1 is lengthened. If the output voltage Vo increases, the output voltage of the error amplifier 32 decreases. Further, the time during which the comparator 63 outputs an L level output signal is shortened, and the activation time of the output transistor T1 is shortened. Such operations activate the output transistor T1 in constant cycles in accordance with the pulse signal of the oscillator 65 and inactivates the output transistor T1 at timings determined in accordance with the magnitude of the output current IL. Thus, the inactivation timing of the output transistor T1 varies in accordance with the output voltage Vo and keeps the output voltage Vo constant.

The DC-DC converter 60 of the fourth embodiment has the advantages described below.

The DC-DC converter 60, which is a current control mode DC-DC converter, detects current flowing through the current detection resistor Rs to keep the output voltage Vo constant. Thus, also in the current control DC-DC converter, the control circuit 61 activates the synchronous rectification output transistor T2 when the input voltage Vi decreases to readily discharge the electric charge stored in the smoothing capacitor C1. This prevents the electric charge stored in the smoothing capacitor C1 from causing a deficiency such as latch-up or burnout. Additionally, the resistance value of the activated output transistor T1 is lower than the resistance value of the discharge resistor compared to when the discharge resistor is connected to the smoothing capacitor C1 in parallel. Therefore, the discharge time is shortened.

It should be apparent to those skilled in the art that the present invention may be embodied in many other specific forms without departing from the spirit or scope of the invention. Particularly, it should be understood that the present invention may be embodied in the following forms.

In the third embodiment, the output transistors T21 and T22 may be incorporated in the control circuit 51. Also, in the fourth embodiment, the output transistors T1 and T2 may be incorporated in the control circuit 61.

The voltage Vo generated by decreasing the input voltage Vi with the step-down DC-DC converter 20, 40, 50, or 60 may be varied if necessary. In addition to a step-down or step-up DC-DC converter, the present invention may be applied to a DC-DC converter for generating a negative voltage or a DC-DC converter for generating a plurality of different voltages in accordance with the configuration of the semiconductor circuit that supplies the output voltage Vo.

The present examples and embodiments are to be considered as illustrative and not restrictive, and the invention is not to be limited to the details given herein, but may be modified within the scope and equivalence of the appended claims.

What is claimed is:

1. A DC-DC converter comprising:
   a main switching transistor for receiving an input voltage;
   a synchronous rectification transistor connected in series to the main switching transistor;
   a choke coil connected to a node between the main switching transistor and the synchronous rectification transistor, with output voltage of the DC-DC converter generated at an output node of the DC-DC converter based on the input voltage by activating the main switching transistor and the synchronous rectification transistor in a complementary manner;
   a smoothing capacitor having a first terminal connected to the choke coil and a second terminal connected to a predetermined voltage, for smoothing the output voltage; and
   a control circuit, connected to the main switching transistor and the synchronous rectification transistor, for determining whether the input voltage decreases below a threshold and for inactivating the main switching transistor and activating the synchronous rectification transistor when the control circuit detects that the input voltage decreases below the threshold.

2. The DC-DC converter according to claim 1, further comprising a power supply capacitor connected to the control circuit,
   wherein the control circuit includes a power supply circuit for receiving the input voltage and charging the power supply capacitor, the power supply circuit generating power supply voltage that is in accordance with the electric charge stored in the power supply capacitor when the input voltage decreases, and the control circuit being operated by the power supply voltage when the input voltage is interrupted to inactivate the main switching transistor and activate the synchronous rectification transistor.

3. The DC-DC converter according to claim 2, wherein the power supply circuit includes:
   an input voltage detector for detecting the input voltage and generating a control signal indicative of the level of the input voltage; and
   a power supply having a switch device connected between the input voltage and the power supply capacitor, the power supply, in response to the control signal, activating the switch device when the input voltage is higher than an operable voltage of the DC-DC converter and inactivating the switch device when the input voltage is lower than the operable voltage.

4. The DC-DC converter according to claim 1, wherein the control circuit includes:
   an error amplifier for comparing a divided voltage of the output voltage with a reference voltage to generate an amplified error signal;
   a triangular wave oscillator for generating a triangular wave signal;
   a PWM comparator, connected to the error amplifier and the triangular wave oscillator, for comparing voltage of the amplified error signal with voltage of the triangular wave signal to generate a first output signal and a second output signal that are complementary to each other in accordance with the comparison result;
   a first drive circuit, connected to the PWM comparator and the main switching transistor, for generating a first control signal based on the first output signal and providing the first control signal to the main switching transistor; and
   a second drive circuit, connected to the PWM comparator and the synchronous rectification transistor, for generating a second control signal based on the second output signal and providing the second control signal to the synchronous rectification transistor.

5. The DC-DC converter according to claim 4, further comprising a power supply capacitor connected to the control circuit,
   wherein the input voltage is supplied as a first power supply voltage to the error amplifier, the PWM comparator, and the triangular wave oscillator; and
   wherein the control circuit includes a power supply circuit for receiving the input voltage and charging the power supply capacitor, wherein when the input voltage decreases, the power supply circuit generates a second power supply voltage that is in accordance with the electric charge stored in the power supply capacitor and supplies the second power supply voltage to the second drive circuit, and when the input voltage is interrupted, the second drive circuit is operated by the second power supply voltage to activate the synchronous rectification transistor.

6. A control circuit for a DC-DC converter including a main switching transistor for receiving an input voltage, a synchronous rectification transistor connected in series to the main switching transistor, a choke coil connected to a node between the main switching transistor and the synchronous rectification transistor, and a smoothing capacitor having a first terminal connected to the choke coil and a second terminal connected to a predetermined voltage,
   wherein the control circuit generates output voltage of the DC-DC converter at an output node of the control circuit based on the input voltage by activating the main switching transistor and the synchronous rectification transistor in a complementary manner, and wherein the control circuit determines whether the input voltage decreases below a threshold and inactivates the main switching transistor and activates the synchronous rectification transistor when the control circuit detects that the input voltage decreases below the threshold.

7. The control circuit according to claim 6, further comprising:
   a power supply capacitor; and
   a power supply circuit, connected to the power supply capacitor, for receiving the input voltage and charging the power supply capacitor, the power supply circuit generating power supply voltage that is in accordance with the electric charge stored in the power supply capacitor when the input voltage decreases, and the control circuit being operated by the power supply voltage when the input voltage is interrupted to inactivate the main switching transistor and activate the synchronous rectification transistor.

8. The control circuit according to claim 7, wherein the power supply circuit includes:
   an input voltage detector for detecting the input voltage and generating a control signal indicative of the level of the input voltage; and a power supply having a switch device connected between the input voltage and the power supply capacitor, the power supply, in response to the control signal, activating the switch device when the input voltage is higher than an operable voltage of the DC-DC converter and inactivating the switch device when the input voltage is lower than the operable voltage.

9. The control circuit according to claim 6, further comprising:
an error amplifier for comparing a divided voltage of the output voltage with a reference voltage to generate an amplified error signal;
a triangular wave oscillator for generating a triangular wave signal;
a PWM comparator, connected to the error amplifier and the triangular wave oscillator, for comparing voltage of the amplified error signal with voltage of the triangular wave signal to generate a first output signal and a second output signal that are complementary to each other in accordance with the comparison result;
a first drive circuit, connected to the PWM comparator and the main switching transistor, for generating a first control signal based on the first output signal and providing the first control signal to the main switching transistor; and
a second drive circuit, connected to the PWM comparator and the synchronous rectification transistor, for generating a second control signal based on the second output signal and providing the second control signal to the synchronous rectification transistor.

10. The control circuit according to claim 9, wherein the input voltage is supplied as a first power supply voltage to the error amplifier, the PWM comparator, and the triangular wave oscillator, the control circuit further comprising:
a power supply capacitor; and
a power supply circuit for receiving the input voltage and charging the power supply capacitor, wherein when the input voltage decreases, the power supply circuit generates a second power supply voltage that is in accordance with the electric charge stored in the power supply capacitor and supplies the second power supply voltage to the second drive circuit, and when the input voltage is interrupted, the second drive circuit is operated by the second power supply voltage to activate the synchronous rectification transistor.

11. A method for controlling a DC-DC converter including a main switching transistor for receiving an input voltage, a synchronous rectification transistor connected in series to the main switching transistor, a choke coil connected to a node between the main switching transistor and the synchronous rectification transistor, and a smoothing capacitor connected to the choke coil, the method comprising:
generating output voltage of the DC-DC converter at an output node of the DC-DC converter based on the input voltage by activating the main switching transistor and the synchronous rectification transistor in a complementary manner;
detecting whether the input voltage decreases below a threshold; and
inactivating the main switching transistor and activating the synchronous rectification transistor when it is detected that the input voltage decreases below the threshold.

12. The method according to claim 11, wherein the DC-DC converter includes a control circuit for controlling the main switching transistor and the synchronous rectification transistor, and a power supply capacitor connected to the control circuit, the method further comprising:
charging the power supply capacitor with the input voltage;
generating power supply voltage that is in accordance with the electric charge stored in the power supply capacitor when the input voltage decreases; and
supplying the power supply voltage to the control circuit so that the control circuit inactivates the main switching transistor and activates the synchronous rectification transistor when the input voltage is interrupted.

13. The method according to claim 11, wherein the DC-DC converter includes a switch device connected between the input voltage and the power supply capacitor, the method further comprising:
detecting the input voltage and generating a control signal indicative of the level of the input voltage; and
in response to the control signal, activating the switch device when the input voltage is higher than an operable voltage of the DC-DC converter and inactivating the switch device when the input voltage is lower than the operable voltage.

14. The method according to claim 11, wherein the DC-DC converter includes an error amplifier for comparing a divided voltage of the output voltage with a reference voltage to generate an amplified error signal, a triangular wave oscillator for generating a triangular wave signal, a PWM comparator, connected to the error amplifier and the triangular wave oscillator, for comparing voltage of the amplified error signal with voltage of the triangular wave signal to generate a first output signal and a second output signal in accordance with the comparison result, a first drive circuit, connected to the PWM comparator and the main switching transistor, for generating a first control signal based on the first output signal and providing the first control signal to the main switching transistor, and a second drive circuit, connected to the PWM comparator and the synchronous rectification transistor, for generating a second control signal based on the second output signal and providing the second control signal to the synchronous rectification transistor, the method further comprising:
supplying the input voltage as a first power supply voltage to the error amplifier, the PWM comparator, and the triangular wave oscillator;
charging the power supply capacitor with the input voltage;
generating a second power supply voltage in accordance with the electric charge stored in the power supply capacitor when the input voltage decreases; and
supplying the second power supply voltage to the second drive circuit.

* * * * *